United States Patent
MacFarlane et al.

(10) Patent No.: US 9,403,154 B2
(45) Date of Patent: Aug. 2, 2016

(54) CATALYSTS AND METHODS OF USE

(75) Inventors: Douglas MacFarlane, Brighton East (AU); Bjorn Winther-Jensen, Mount Waverly (AU); Alexey Izgorodin, East Malvern (AU)

(73) Assignee: MONASH UNIVERSITY, Clayton (AU)

( * ) Notice: Subject to any disclaimer, the term of this patent is extended or adjusted under 35 U.S.C. 154(b) by 3 days.

(21) Appl. No.: 14/006,537

(22) PCT Filed: Mar. 22, 2012

(86) PCT No.: PCT/AU2012/000302
§ 371 (c)(1),
(2), (4) Date: Oct. 29, 2013

(87) PCT Pub. No.: WO2012/126062
PCT Pub. Date: Sep. 27, 2012

(65) Prior Publication Data
US 2014/0034510 A1 Feb. 6, 2014

(30) Foreign Application Priority Data

Mar. 22, 2011 (AU) ................. 2011901049

(51) Int. Cl.
*B01J 23/00* (2006.01)
*B01J 23/06* (2006.01)
(Continued)

(52) U.S. Cl.
CPC ............... *B01J 27/187* (2013.01); *C25B 1/003* (2013.01); *C25B 1/04* (2013.01); *C25D 3/665* (2013.01);
(Continued)

(58) Field of Classification Search
CPC ............ B01J 23/00; B01J 23/06; B01J 23/08; B01J 23/16; B01J 23/28; B01J 23/34; B01J 23/76; B01J 23/80; B01J 23/825; B01J 23/83; B01J 23/84; B01J 27/00; B01J 27/057; B01J 27/0573; B01J 27/0576; B01J 27/14; B01J 27/186; B01J 37/00
USPC ......... 502/208, 211, 213, 215, 216, 220–222; 252/500, 518.1, 519.14, 519.4, 521.1, 252/521.2, 521.5
See application file for complete search history.

(56) References Cited

U.S. PATENT DOCUMENTS

| 4,439,301 A | 3/1984 | Reichman et al. |
| 2005/0051439 A1* | 3/2005 | Jang .............................. 205/639 |

(Continued)

FOREIGN PATENT DOCUMENTS

| WO | 2011/029197 | * | 3/2011 | ............... C25D 3/38 |
| WO | 2011/029197 A1 | | 3/2011 | |

OTHER PUBLICATIONS

"Electrodeposition of chalcopyrite films from ionic liquid electrolytes," D. D. Shivagan et al. Thin Solid Films 515 (2007), pp. 5899-5903.*

(Continued)

*Primary Examiner* — Patricia L Hailey
(74) *Attorney, Agent, or Firm* — Sughrue Mion, PLLC (57) ABSTRACT

The present invention relates to a catalyst comprising (i) a semiconductor preferably comprising one or more metal-(Group VIb) semiconductors, and (ii) a semiconductor material having elevated phosphorous content preferably comprising one or more metal-(Group VIb))-phosphorous species.

9 Claims, 6 Drawing Sheets
(5 of 6 Drawing Sheet(s) Filed in Color)

(51) Int. Cl.
| | |
|---|---|
| B01J 23/08 | (2006.01) |
| B01J 23/16 | (2006.01) |
| B01J 23/28 | (2006.01) |
| B01J 23/34 | (2006.01) |
| B01J 23/76 | (2006.01) |
| B01J 23/80 | (2006.01) |
| B01J 23/825 | (2006.01) |
| B01J 23/83 | (2006.01) |
| B01J 23/84 | (2006.01) |
| B01J 27/00 | (2006.01) |
| B01J 27/057 | (2006.01) |
| B01J 27/14 | (2006.01) |
| B01J 27/186 | (2006.01) |
| B01J 37/00 | (2006.01) |
| B01J 27/187 | (2006.01) |
| C25B 1/04 | (2006.01) |
| C25D 3/66 | (2006.01) |
| C25D 9/08 | (2006.01) |
| H01L 21/02 | (2006.01) |
| C25B 1/00 | (2006.01) |
| C25B 11/04 | (2006.01) |
| C25B 3/04 | (2006.01) |

(52) U.S. Cl.
CPC ... *C25D 9/08* (2013.01); *C25B 1/00* (2013.01); *C25B 3/04* (2013.01); *C25B 11/0478* (2013.01); *H01L 21/02565* (2013.01); *H01L 21/02568* (2013.01); *Y02E 60/366* (2013.01)

(56) References Cited

U.S. PATENT DOCUMENTS

| | | | |
|---|---|---|---|
| 2008/0128665 A1* | 6/2008 | Wu et al. | 252/518.1 |
| 2009/0068820 A1* | 3/2009 | Chan et al. | 438/478 |
| 2010/0167072 A1 | 7/2010 | Chouai et al. | |
| 2011/0037029 A1* | 2/2011 | Liu et al. | 252/500 |
| 2012/0319054 A1* | 12/2012 | Kim et al. | 252/500 |
| 2013/0084474 A1* | 4/2013 | Mills | 429/9 |

OTHER PUBLICATIONS

International Search Report of PCT/AU2012/000302, dated Apr. 18, 2012.
International Preliminary Report on Patentability and Written Opinion issued in corresponding PCT/AU2012/000302 dated Oct. 3, 2013.

* cited by examiner

CATALYSTS AND METHODS OF USE

CROSS REFERENCE TO RELATED APPLICATIONS

This application is a National Stage of International Application No. PCT/AU2012/000302 filed Mar. 22, 2012, claiming priority based on Australian Patent Application No. 2011901049, filed Mar. 22, 2011, the contents of all of which are incorporated herein by reference in their entirety.

FIELD OF INVENTION

The present invention relates to the field of catalysts. In one form, the invention relates to electrocatalysts, including photo-electrocatalysts.

In a particularly preferred embodiment, the invention relates to the use of electrocatalysts for reduction processes, or oxidation processes such as water splitting.

In another form the invention relates to a novel method of electrochemical deposition from ionic liquid electrolytes. In a particularly preferred embodiment, the method is used for electrodeposition of catalysts.

While it will be convenient to hereinafter describe the invention with particular reference to water oxidation or water splitting, it should be appreciated that the present invention is not limited to that use only and can have many other applications. Furthermore, while it is also convenient hereafter to describe the invention with particular reference to photo-electrocatalysis, it should be appreciated that the present invention is not limited to that use but has more general application in catalysis.

BACKGROUND ART

It is to be appreciated that any discussion of documents, devices, acts or knowledge in this specification is included to explain the context of the present invention. Further, the discussion throughout this specification comes about due to the realisation of the inventor and/or the identification of certain related art problems by the inventor. Moreover, any discussion of material such as documents, devices, acts or knowledge in this specification is included to explain the context of the invention in terms of the inventor's knowledge and experience and, accordingly, any such discussion should not be taken as an admission that any of the material forms part of the prior art base or the common general knowledge in the relevant art in Australia, or elsewhere, on or before the priority date of the disclosure and claims herein.

The modern technological era relies on a steady, reliable supply of energy, for use in all aspects of everyday life. One of the most attractive ways to store and transport energy produced from renewable sources is based on splitting of water into oxygen and hydrogen.

Water splitting is the separation of water into its constituents—oxygen ($O_2$) and hydrogen ($H_2$). Photo-electrochemical water splitting involves breaking down water into hydrogen and oxygen by electrolysis, but the electrical energy is supplied from a photo-electrochemical cell (PEC) process. This system is often colloquially referred to as 'artificial photosynthesis'.

Water splitting is one of the simplest ways to produce high purity hydrogen. Although the efficiency of water electrolysis lies in the range of 50-70%, the cost of hydrogen produced by this method is in the range of $20-30/GJ (assuming $0.05/kWh), compared to $6-12/GJ produced via natural gas reforming and coal gasification. (S A Sherif, F Barbir and T N Veziroglu, *Solar Energy* 2005, 78, 647-660)

If the water splitting process is assisted by photo-catalysts suspended directly in water instead of using photovoltaic and an electrolytic system the reaction comprises a single step and is therefore more efficient.

Photo-catalysis or photo-electrochemical splitting of water into hydrogen and oxygen can be used to collect and store energy on a global scale. In essence it consists of capturing energy and storing it in the form of chemical bonds to yield solar fuels which can be used as needed. Thus water splitting to produce hydrogen is a potentially major post-petroleum energy solution.

For example, in one future scenario rooftop solar panels could provide electricity to a home, and any excess electricity would be directed to an electrolyser (that is, a device for splitting water molecules) to produce hydrogen, which would be stored in tanks. When more energy was needed, the hydrogen would be fed to a fuel cell, where it would combine with oxygen from the air to form water, and generate electricity at the same time.

An electrolyser comprises two different electrodes, one which releases oxygen molecules and the other which releases hydrogen molecules. Although the half-reaction that produces hydrogen provides the storable source of energy, the half-reaction that produces oxygen is more difficult to optimise and control. Specifically, the half-reaction to produce oxygen is particularly demanding because it requires the distribution of four redox processes over a narrow potential range, the coupling of multiple proton and electron transfers, and the formation of two oxygen-oxygen bonds. Controlling parameters to optimise the efficiency and the conditions under which the reaction occurs is key to the overall viability of energy storage via water splitting.

However one major problem in obtaining efficient water splitting devices has been the stability of, and the significant over-potential on the oxygen producing electrode.

Overpotential is a term well known to those skilled in the electrochemical art and refers to the potential (voltage) difference between a half-reaction's thermodynamically determined reduction potential and the experimentally observed potential at which the redox event occurs. Overpotential is directly related to a cell's voltage efficiency. In an electrolytic cell the overpotential requires more energy than thermodynamically expected to drive a reaction and the energy difference is lost as heat. Overpotential is specific to each cell design and can vary between cells and operational conditions even for the same reaction.

One of the main obstacles to improved efficiency of the water splitting processes lies in development of catalysts that meet the broad requirements of practical applications. Ideally the catalyst should be based on abundant, low cost materials, have high turnover frequencies, remain active over prolong periods of time and be able to regenerate itself.

The oxygen producing electrode is commonly made of materials such as platinum, manganese oxides and Mischmetal oxides. Mischmetals are typically alloys of rare earth elements in various naturally-occurring proportions, and include cerium mischmetal, rare earth mischmetal or just 'misch metal'. A typical composition includes approximately 50% cerium and 25% lanthanum, with small amounts of neodymium and praseodymium. Scarce metal elements such as iridium and cobalt have also been included in the composition of the electrode but add significantly to the cost of the electrode.

The broad range of water oxidation catalysts developed so far allows for water oxidation in concentrated basic solutions (pH>13) by materials based on the perovskite metal oxides ($RuO_2$, $IrO_2$, $Co_3O_4$, $MnO_2$ etc.) and under neutral or acidic conditions (pH<1) by precious metals and their oxides (e.g. Pt, $PtO_2$). The over-potentials achieved by noble metal catalysts are around 320 mV.

Among heterogeneous oxygen-evolving catalysts, one of the highest activities was produced from material formed upon anodic polarization in phosphate solutions containing Co(II). Although the catalyst is able to oxidize water in neutral pH and at room temperature water oxidation occurred at potential around 1.2V vs NHE which corresponds to about 400 mV of over-potential, indicating that improvements are needed before this catalyst will be energetically efficient.

Furthermore, in recent times novel, improved oxygen producing electrodes have been made from cobalt phosphates and iridium oxides and reportedly have over-potentials of 0.4V and 0.25V respectively. (Y. Surendranath, M. W. Kanan, D. G. Nocera, *J. Am. Chem. Soc.* 2010, 132, 16501-16509; S. D. Tilley, M. Cornuz, K. Sivula, M. Graetzel, *Angew. Chem. Int. Ed.* 2010, 49, 6405-6408). Despite the improved performance of these novel materials as compared with the prior art, the over-potential is still substantial and they are comparatively expensive due to the inclusion of the scarce metal elements.

Thus there has been a continuing search to satisfy the need for better and more cost efficient materials for use as catalysts. There is also a need to improve the efficiency and stability of catalytic reactions, including photo-electrochemical reactions such as water splitting.

Consistent with this, there is a need for improved methods of creating catalysts.

SUMMARY OF INVENTION

An object of the present invention is to provide better and more cost efficient materials for electrocatalysis.

A further object of the present invention is to provide improved stability and efficiency of electrocatalysis and associated photo-electrochemical reactions.

A further object of the present invention is to provide an improved method of electrodeposition that is suitable for manufacturing catalysts, particularly electrocatalysts.

A further object of the present invention is to alleviate at least one disadvantage associated with the related art.

It is an object of the embodiments described herein to overcome or alleviate at least one of the above noted drawbacks of related art systems or to at least provide a useful alternative to related art systems.

Catalyst

In a first aspect of embodiments described herein there is provided a catalyst comprising:
 a semiconductor, and
 a semiconductor material having elevated phosphorous content.

Semiconductors materials exhibit electrical conductivity due to electron flow that is intermediate in magnitude between that of a conductor and an insulator. They are usually crystalline solids, but amorphous and liquid semiconductors are known. Traditional semiconductors include species such as $MnO_a$, GaAs, metal sulphides such as CdS and metal oxides such as ZnO.

In second aspect of embodiments described herein there is provided a catalyst comprising:
 one or more metal-(Group VIb) semiconductors, and
 one or more metal-(Group VIb))-phosphorous species.

The metal-(Group VIb) semiconductor corresponds generally to the formula $M_mA_a$ wherein, M is a metal,
A is a Group VIb species, and
m and a have a value of between 1 and 5.

The metal-(Group VIb)-phosphorous species corresponds generally to the formula $M'_mA'_aP_y$ wherein, M' is a metal and may be the same as M,
A' is a Group VIb species and may be the same as A,
m, m', a and a' have a value of between 1 and 5,
P is a phosphorous species, and
y has a value 0<y<5.

The metal (M or M') could be any metal traditionally used in semiconductors, but would typically include elements such as Ti, Mo, Mn, Fe, Co, Ni, Cu, Zn, Ga, Ir, Cd, In, Sn and the rare-earth metals. The term 'metal' is to be construed as including one elemental metal or combinations of two or more elemental metals.

The Group VIb species (A or A') includes any non-radioactive member of the chalcogens, namely oxygen, sulphur, selenium and tellurium. For the avoidance of doubt, references herein to Group VIb is designated according to the old IUPAC (European) system and corresponds to (i) Group VIA of the CAS (American) system, and (ii) Group 16 of the new IUPAC system. (Leigh, G J, Nomenclature of Inorganic Chemistry: Recommendations 1990, Blackwell Science.)

The metal-(Group VIb) materials can be produced by a wide range of methods well known to the person skilled in the art. They can be in the form of a solid, a film or particles such as flakes depending on the production method and intended use.

Typically the metal-(Group VIb) materials are combined with metal-(Group VIb)-phosphorus by coating of the former by the latter. The coating is typically thin. Preferably the coating ranges from 1 to 1000 nm, more preferably 5 to 300 nm. Metal-(Group VIb) materials used as catalysts are often physically configured to maximise their porosity and surface area. Accordingly the coating is unlikely to be smooth or even, but instead include discontinuities and variations in thickness. The coating may also coat the inside of the surface pores or internal structure(s). Typically the metal-(Group VIb) materials can be visually distinguished from the metal-(Group VIb)-phosphorus coating. However in some cases there may be incorporation of one material into the other.

In another aspect of embodiments described herein there is provided a system for electrochemical reactions, particularly a photo-electrochemical reaction such as water splitting, the system comprising a catalyst according to the present invention.

In another aspect of embodiments described herein there is provided an apparatus such as an electrolyser including an electrode comprising an electro-catalyst according to the present invention.

Process

In a further aspect of embodiments described herein the catalyst of the present invention is at least partly prepared by electrodeposition.

Typically the electrodeposition includes the step of depositing an electrolyte from an ionic liquid or alternatively, from an aqueous or solvent based solution.

In one aspect of embodiments described herein there is provided a method of at least partly preparing the catalyst of the present invention comprising the steps of:
 preparing an aqueous solution comprising at least one principal electrolyte and at least one supporting electrolyte,
 applying a source of energy to the aqueous solution, and
 depositing the principal electrolyte, and optionally the supporting electrolyte at a cathode using electrolysis.

Preferably the supporting electrolyte is chosen from the group comprising primary, secondary, tertiary or quaternary nitrogen or phosphorous species or combinations thereof.

In a particularly preferred aspect of embodiments described herein there is provided an electrodeposition process comprising the steps of:
preparing an ionic liquid comprising at least one electrolyte,
applying a source of energy to elevate the temperature of the ionic liquid to at least 130° C., and
depositing the at least one electrolyte at a cathode using electrolysis.

In one preferred approach, coating/coverage of the metal-(Group VIb) materials with the novel phosphorous containing layer is carried out using the aforementioned electrodeposition from an ionic liquid electrolyte. Preferably the ionic liquid includes at least one species that is a source of phosphorous ions, ensuring a sufficient high phosphate content to form the intended metal-(Group VIb)-phosphorus species.

The ionic liquid may comprise other sources of elements. For example it may comprise one or more salts. It may also contain water, other solvents or mixtures of solvents.

The compositional parameters and physical parameters of the ionic liquid electrolyte may be optimised according to the nature of the reaction being carried out. For example, deposition of CdS from ionic liquid electrolyte may vary according to the sulphur source, the other components of the ionic liquid and the temperature of the ionic liquid.

To initiate the integration of the metal-(Group VIb)-phosphorous species into or onto the metal-(Group VIb) materials, a source of energy such as light and/or potential and/or heat can be applied to the metal-(Group VIb) materials. The resultant thin coatings are mechanically, chemically and electrochemically stable.

The layered metal-(Group VIb)/ metal-(Group VIb)-phosphate materials can be used in any convenient form. For example they may be used as an electrode, applied to an existing electrode or be part of a stand alone photo-catalytic assembly.

In a further aspect of embodiments described herein there is provided a method of manufacturing an electrode comprising the step of at least partially coating a metal with layered metal-(Group VIb)/ metal-(Group VIb)-phosphate materials according to the present invention. The method of manufacturing may comprise the aforementioned process using ionic liquid electrolytes.

In a yet further aspect of embodiments described herein there is provided a method of forming the electro-catalyst of the present invention comprising the steps of:
preparing material of formula $M_m A_a$,
using the aforementioned ionic liquid process to apply a coating of formula $M'_{m'} A'_{a'} P_y$ to the material of formula $M_m A_a$,
M is a metal,
A is a Group VIb species,
m and a have a value of between 1 and 5,
M' is a metal and may be the same as M,
A' is a Group VIb species and may be the same as A,
m' and a' have a value of between 1 and 5,
P is a phosphorous species, and
y has a value $0 < y < 5$, Catalysts according to the present invention would have many applications including the following:
as electrodes or part of electrodes in conventional electrolysers for hydrogen production, substituting, for example, for conventional anode materials;
in reduction processes, such as $CO_2$ reduction or $NH_3$ production;
in oxidation reactions, such as $SO_2$ oxidation;
in various electrochemical reactions, including photo-electrochemical processes;
as part of a water-splitting device, such as those driven by solar cells;
in a water-splitting device integrated with photo-electrodes, photocells or the like. Typically such a device would be solar driven. In some cases the metal-(Group VIb) materials (for example, CdS) and/or the metal-(Group VIb)-phosphates would comprise the photo-electrode or a part of a photo-electrode system.

Other aspects and preferred forms are disclosed in the specification and/or defined in the appended claims, forming a part of the description of the invention.

In essence, embodiments of the present invention stem from the realization that an improved catalyst, particularly electro-catalyst, can be obtained from a composition that includes an elevated phosphorous content.

Advantages provided by the present invention comprise the following:
more cost efficient manufacture of catalysts;
more cost efficient manufacture of electrodes comprising the catalysts;
improved stability and efficiency of electrochemical reactions that involve use of the catalysts;
reduced over-potential of electrodes comprising the catalysts;
the catalyst is insoluble in water and some other common solvents.

Further scope of applicability of embodiments of the present invention will become apparent from the detailed description given hereinafter. However, it should be understood that the detailed description and specific examples, while indicating preferred embodiments of the invention, are given by way of illustration only, since various changes and modifications within the spirit and scope of the disclosure herein will become apparent to those skilled in the art from this detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Further disclosure, objects, advantages and aspects of preferred and other embodiments of the present application may be better understood by those skilled in the relevant art by reference to the following description of embodiments taken in conjunction with the accompanying drawings, which are given by way of illustration only, and thus are not limitative of the disclosure herein, and in which:

FIG. 8 illustrates SEM images of the electrodeposited catalyst (FIG. 8a) and this after oxidation in BADHP 50% $H_2O$ under light irradiation (FIG. 8b)

EXAMPLES

The present invention will now be further described with reference to the following non-limiting examples.

Example 1

Preparation of Layered Material—$M_m A_d / M'_m A'_d P_y$

Example 1 describes preparation of a layered material of formula $M_m A_d / M'_m A'_d P_y$ wherein M and M' are manganese, A and A' are oxygen and m and m' are 1 (ie $MnO_a / MnO_a P_y$). This novel manganese based catalyst, electrodeposited from protic ionic liquid is an effective water oxidation catalyst. The catalytic performance of prepared material can be significantly enhanced upon light irradiation, which makes it especially attractive for the use in conjunction with solar driven electrochemical water splitting.

Preparation of $MnO_a$

Manganese oxide was electrodeposited on the surface of gold from butyl ammonium nitrate (BAN) ionic liquid (IL) pH 7 at elevated temperatures (100-120° C.). BAN for this work was prepared by neutralizing butyl ammonium hydroxide with a diluted solution of nitric acid and subsequent drying under vacuum to remove water. IL electrolyte contains 0.01 M manganese acetate and 10 wt % of water.

In a typical procedure, chronopotentiometry at I=100 microamperes for 1 min was used to prepare films on the 1 $cm^2$ of electrode surface.

Preparation of $MnO_a Py$ Coating

Figure 1:
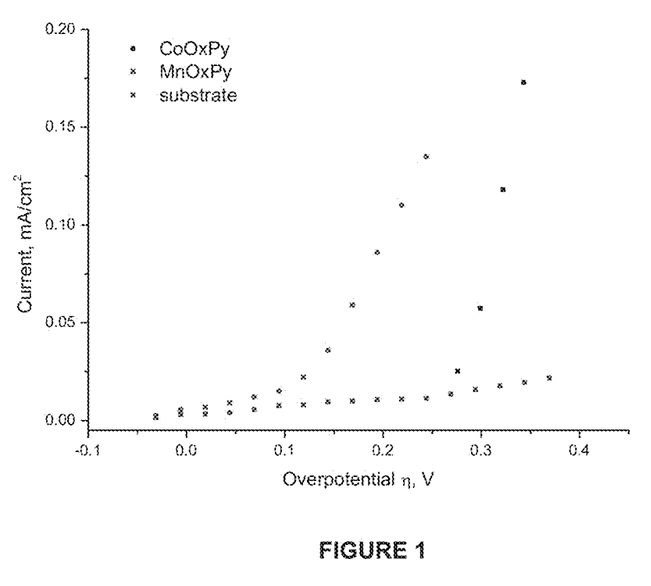
FIG. 1 illustrates a plot of current density dependence on the value of over potential in butyl ammonium dihydrogen phosphate (BADHP) 50% $H_2O$ at pH 8.9.

For the preparation of $MnO_a P_y$ the films of $MnO_a$ were electrodeposited using method described above. The layer was formed upon applying of oxidation potential in IL electrolyte containing BADHP (pH 7-10.5) with 50 wt % $H_2O$. The potential was controlled using chronoamperometry and was set to be 200 mV above the equilibrium potential for water oxidation reaction at particular electrolyte pH. Steady state experiments shown in FIG. 1 confirm high catalytic activity of the prepared material compared to previously reported for CoOxPy by Nocera et. al.

$MnO_a P_y$ is an effective electrocatalyst having the advantages of providing a water-oxidation over-potential of only 0.15V and containing only abundant elements (ie excluding scarce elements). It also has the advantage of being insoluble in water, and stable under long-term water-oxidation testing in the dark, as well as under illumination.

The data suggest that electro catalytic performance can be further increased if uncompensated iR drop is reduced through deposition on more conductive substrates or improving ohmic contact with the substrate.

Figure 2:
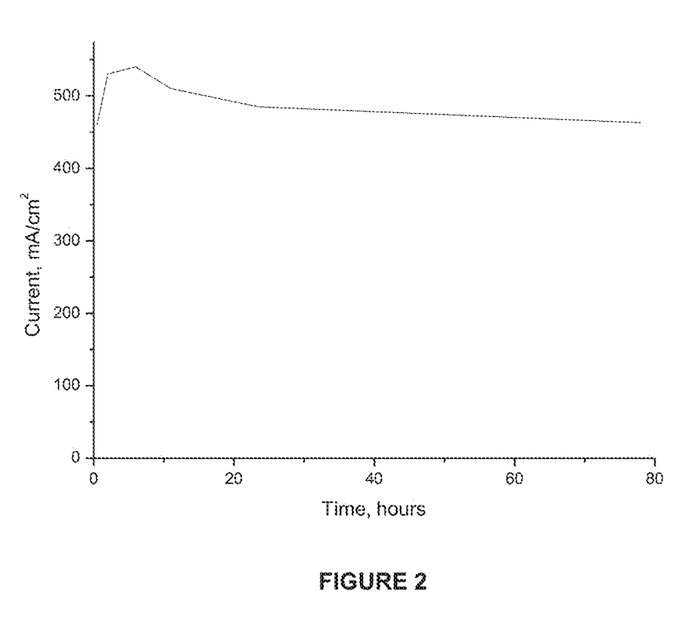
FIG. 2 illustrates a current density profile for the water oxidation reaction on the surface of $MnO_a Py$ at 200 mV over potential in EA 50% $H_2O$ pH=10 under light illumination.
Figure 3:
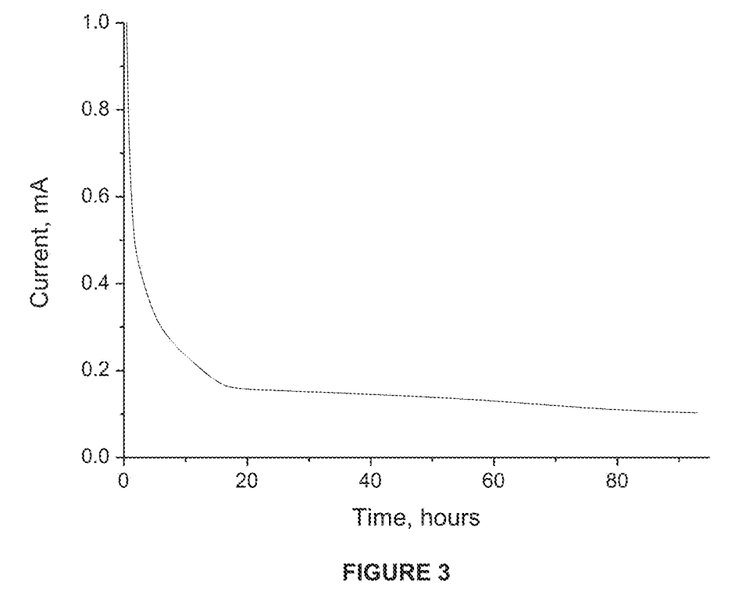
FIG. 3 illustrates current density profile for the water oxidation reaction on the surface of $MnO_a Py$ at 200 mV over potential in BADHP 50% $H_2O$ pH=10.5.

$MnO_a P_y$ catalyst shows very good long term stability in basic electrolyte even under prolong light irradiation (>1 sun), as seen in FIG. 2. In addition, the catalyst retains high catalytic during water oxidation in BADHP with 50 wt % $H_2O$ as seen in FIG. 3.

Example 2

Example 2 illustrates a novel method of electrochemical deposition from ionic liquid (IL) electrolytes at high temperature for electrodeposition of manganese based catalyst. The electrodeposited films show excellent catalytic activity under light irradiation and good long-term stability towards the water oxidation reaction. The catalytic performance exceeds that, for example, of a cobalt based catalyst that operates in neutral electrolytes.

Ionic liquids have been successfully used for the electrodeposition of a number of metals such as Se, In, Cu, Mn, Au, Pt and some semiconductors including Ge, Si, $TiO_2$, AlSb, ZnSb, InSb, GaAs, CdS, CdTe, CuInSe, Cu(In,Ga)Se and ZnTe. One of the key advantages of using ILs for electrodeposition lies in the combination of their thermal and electrochemical stability, which allows the electrodeposition process to be carried even at elevated temperatures with minimal interference from solvent chemical, or electrochemical, breakdown.

Electrodeposition of Manganese Oxide from Ionic Liquid

Manganese oxide was electrodeposited on the surface of fluorine doped tin oxide (FTO) (sheet resistance 15 Ohm per square) from ethyl ammonium nitrate (EAN) at elevated temperature (120° C.). Ethyl ammonium nitrate for this work was prepared by neutralizing ethyl ammonium hydroxide with a diluted solution of nitric acid and subsequent drying under vacuum to remove water. A small amount of water (10 vol %) was added to the IL to assist with dissolution of manganese acetate forming 0.01 molar concentration.

Prior to use, the electrodes were sonicated in water solution of the DOBATEC detergent, washed several times with deionized water, and sonicated in ethanol to remove traces of the detergent. In order to improve the catalytic performance of the FTO electrodes, nanoislands of platinum were deposited through thermal decomposition of hexachloroplatinic acid hexahydrate at 400° C. In a typical procedure the 10 mM solution in ethanol was doctor bladed on the surface of the FTO with a subsequent heat treatment for 15 minutes using a Leister HOTWINDS hot air blower.

Thin films of manganese oxide were electrodeposited from ethyl ammonium nitrate ionic liquid containing 0.01 M Mn(II) and 10% of $H_2O$ at 100° C., leading to formation of dark brown film on the substrate surface. Catalytic activity towards water oxidation was measured by chronoamperometry, changing potential stepwise (50 mV) after steady current density was established. The typical experimental setup consisted of a glass cell with platinum counter electrode isolated using fritted glass and Ag/AgCl "no leak" reference electrode.

Figure 4:
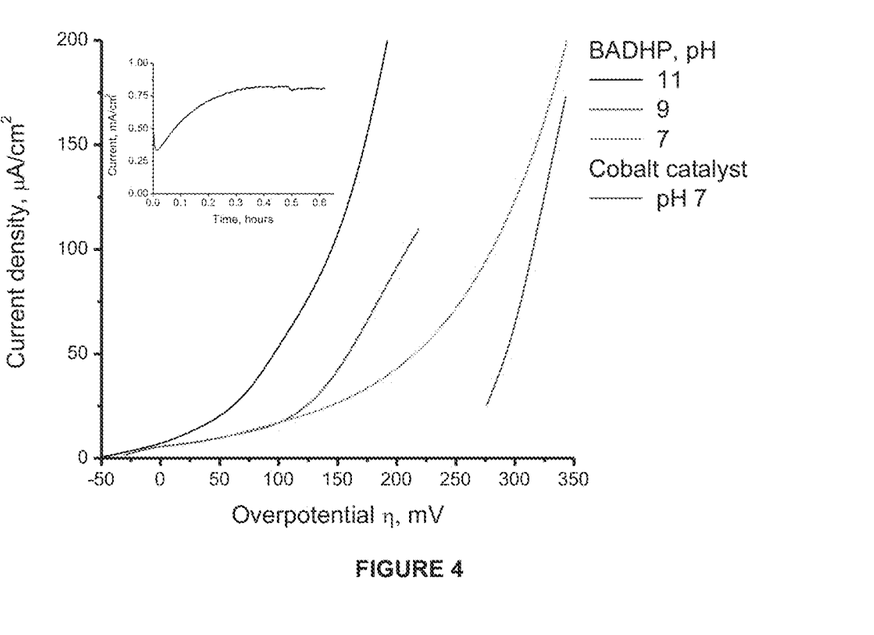
FIG. 4 illustrates the catalytic performance of manganese catalyst during water oxidation in aqueous electrolyte at various pH compared with the data reported for cobalt based catalyst.

Catalytic activity of manganese oxide was significantly enhanced during water oxidation in butyl ammonium dihydrogen phosphate (BADHP) ionic liquid containing 50% of water, as shown in the inset of FIG. 4. The current densities during oxidation at various electrolyte pH are plotted as a function of overpotential in FIG. 4 and compared to the data reported by Nocera et. al. for cobalt based catalyst. The manganese based catalyst shows superior performance compared to the cobalt based catalyst prepared by Nocera et. al. The data suggest that electro catalytic performance can be further increased if uncompensated iR drop is reduced by improving ohmic contact with the substrate.

Prior to the experiment the film was oxidized in BADHP 50% $H_2O$ at 200 mV overpotential with a charge density equal to 0.5 mAh/cm². Inset to FIG. 4 shows current density dependence over time of water oxidation in BADHP with 50% $H_2O$ at pH 11 and 200 mV overpotential.

FIG. 4 additionally shows the effect of visible light irradiation on catalyst performance during water oxidation. It could be seen that at certain current density over potential can be reduced by as much as 100-200 mV. Thus by utilising the light it became possible to achieve high catalytic activity in both neutral and basic electrolytes even at very low overpotentials.

Figure 5:
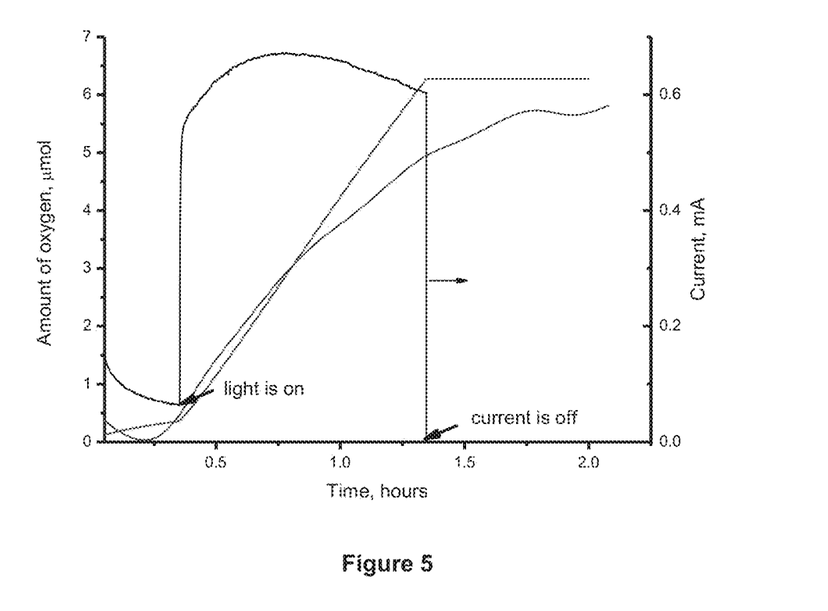
FIG. 5 illustrates the amount of oxygen produced during water oxidation in aqueous electrolyte (pH 12) at 200 mV over potential upon light illumination (when light is on or off) and theoretically expected values (diagonal line) based on the Faradays law.

Due to the high catalytic activity of prepared $MnO_a$ films, moderate over potential (200 mV) was chosen to investigate performance during prolong water oxidation. The amount of oxygen produced over time was measured using DO probe, with the results being in accord with the expected values calculated from Faraday's law, as shown in FIG. 5 upon light irradiation.

Figure 6:
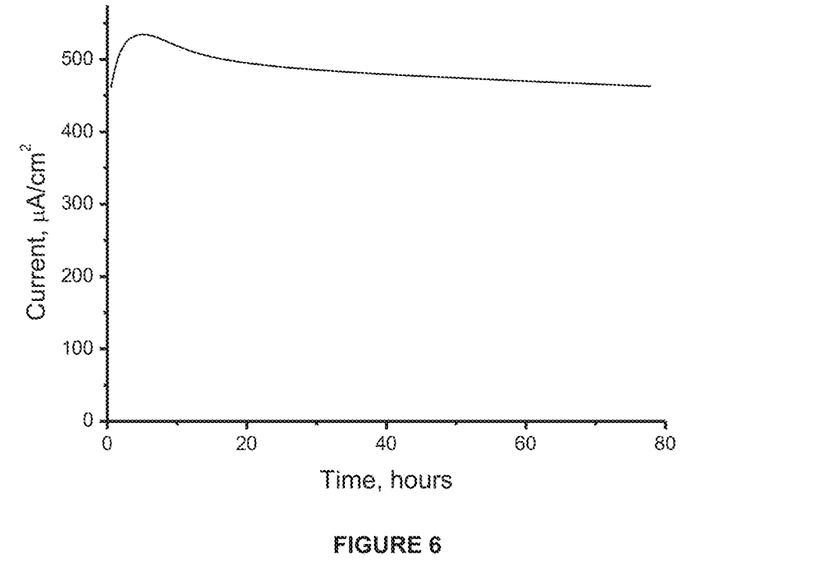
FIG. 6 illustrates the current density profile for the water oxidation reaction at 200 mV over potential in aqueous electrolyte pH=12 upon light irradiation (black) and in the dark (red)

The material showed excellent stability during water oxidation in aqueous electrolyte (pH 12) with and without light irradiation as shown in FIG. 6. However, during prolong oxidation in BADHP based electrolyte the reduction in current density was observed.

Figure 7A:
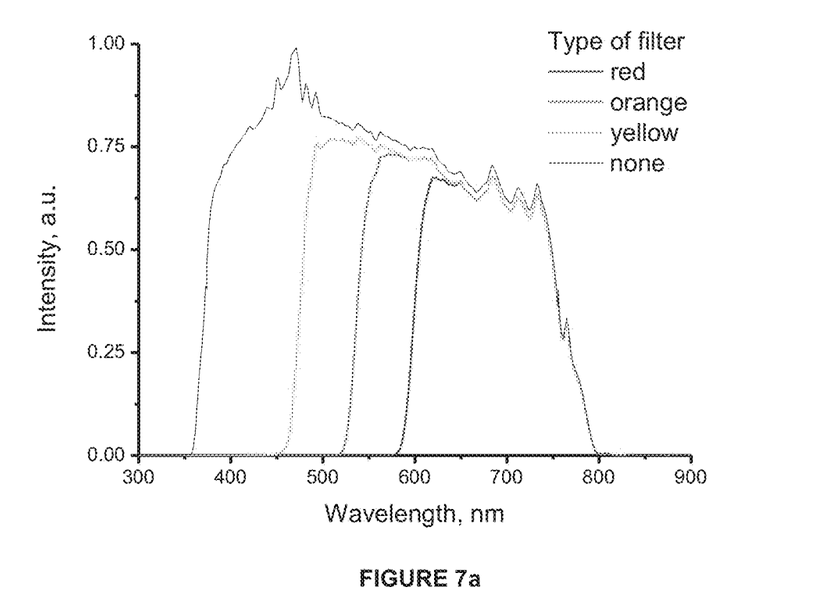
FIG. 7a illustrates the spectra of the Xe light source with various cut off filters (top)
Figure 7B:
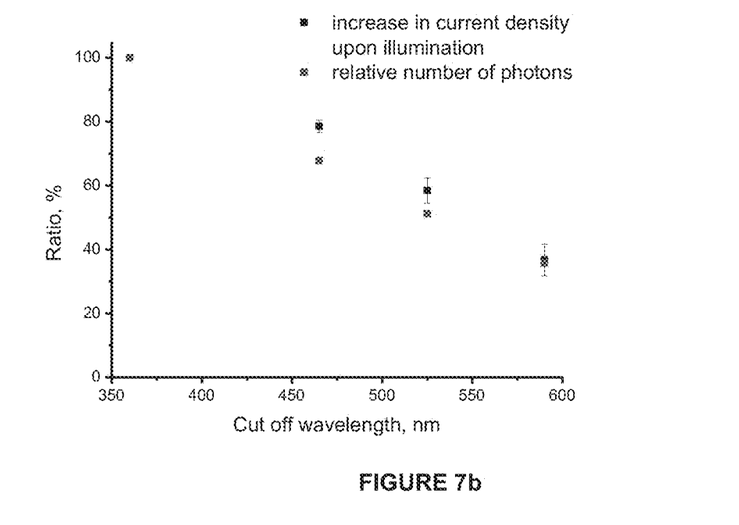
FIG. 7b illustrates the enhancement in catalytic activity of $MnO_a$ films during water oxidation and relative number of the photos present available using various types of cut off filters.

In order to determine the influence of light radiation on catalytic performance, several cut off filters were applied to the Xe light source resulting in the spectrum shown in FIG. 7a. The increase in catalytic activity was observed even under irradiation with small energy photons (<600 nm). Thus, it may be possible to utilize these photons for energy conversion that would otherwise be left out in a standard photovoltaic cell.

The chemical composition of as prepared films and changes in film composition after treatment in BADHP were investigated using XPS and EDX techniques. The XPS data indicates an increase in the amount of phosphor and oxygen compared to manganese in treated samples. Comparison of the XPS data (as shown in Table 1) with the data reported for different oxidation states of manganese (as shown in Table 2) suggests formation of oxide containing $Mn^{3+}$ and $Mn^{4+}$.

TABLE 1

Summary of XPS data measured on as prepared and treated MnOx catalyst.

| Type of levels | Binding energy, eV | MnOx | MnOx after oxidation in BADHP 50% $H_2O$ Intensity |
|---|---|---|---|
| O 1s | 530 | 34.82 | 19.33 |
|  | 531.2 | 50.16 | 54.1 |
|  | 532 | 15.02 | 26.56 |
| Mn $2p_{3/2}$ | 642.5 | 55.65 | 46.99 |
|  | 644-645 | 10.18 | 18.05 |
| Mn $2p_{1/2}$ | 654-655 | 28.67 | 25.2 |
|  | 656.5 | 5.5 | 9.76 |
| Mn 3s | 84-85 | 42.2 | 44.48 |
|  | 89.5 | 43.21 | 40.25 |
|  | 92-93 | 14.39 | 15.27 |

| Element | Intensity | |
|---|---|---|
| Mn | 1 | 1 |
| O | 3.78 | 6.45 |
| P | 0.02 | 0.48 |

TABLE 2

Comparison of XPS data on Mn2O3 and MnO2 with data measured for catalyst prepared in this work.

|  | $Mn_2O_3$ | $MnO_2$ | MnOx | MnOx after oxidation in BADHP 50% $H_2O$ |
|---|---|---|---|---|
| Binding energy Mn $2p_{3/2}$, eV | 641.8 | 642.5 | 642.5 | 642.5 |
| $\Delta E_{3S}$ | 5.5 | 4.5 | 4.5-5.5 | 4.5-5.5 |
| Intensity ratio O 1s:Mn $2p_{3/2}$ | 0.9 | 1.2 | 0.9 | 1.15 |

Figure 8A:
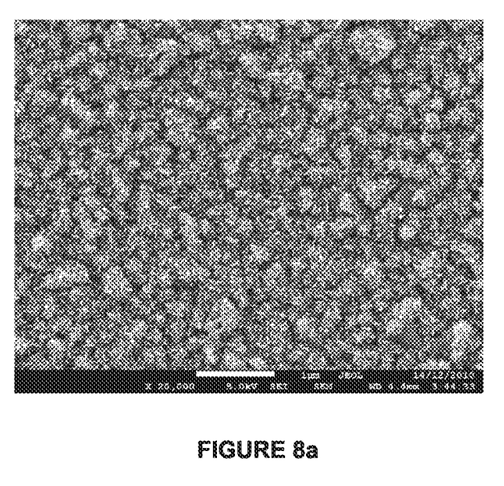
Figure 8B:
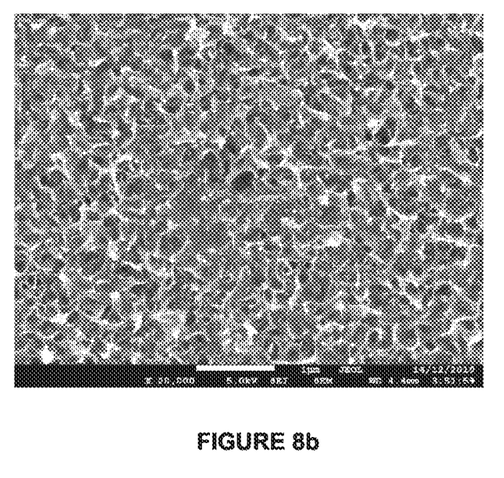

After prolonged water oxidation no changes were observed in the optical appearance of the film. SEM images before and after the long-term water oxidation (as shown in FIG. 8a and FIG. 8b) confirm maintenance of the structural integrity by the films, while various changes in morphology are evident. After water oxidation in BADHP the films appear to have very uniform areas (circled in FIG. 8b) that are not present during oxidation in basic aqueous electrolyte.

Figure 9:
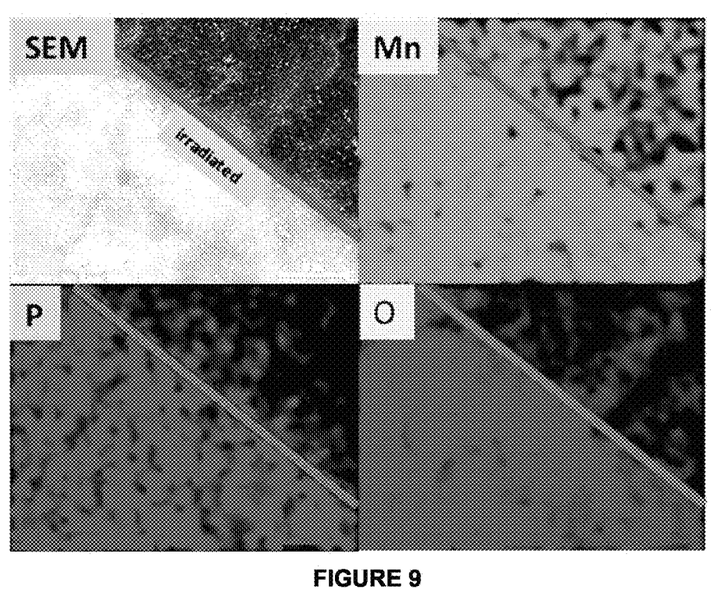
FIG. 9 includes EDX images of manganese based catalyst after water oxidation in BADHP under light irradiation.

Additionally to XPS data, EDX element mapping images also show higher phosphor and oxygen content in the irradiated areas (as shown in FIG. 9), further supporting XPS results.

The electrocatalytic activity of manganese dioxide nanoparticles electrodeposited on Pt, Au, and glassy carbon electrodes towards water oxidation in basic solutions was studied by Ohsaka et al. Performance was enhanced significantly through the deposition of the manganese oxide. Similar to the work on nickel oxide catalysts, a plausible explanation for the high catalytic activity was based on the role of a catalytic mediator γ-MnOOH on the charge transfer during water oxidation (Equations 1, 2).

$$MnO2+(OH)ads \rightarrow \gamma\text{-}MnOOH+(O)ads \qquad \text{(Equation 1)}$$

$$2\gamma\text{-}MnOOH+(O\text{---})ads \rightarrow 2MnO2+H2O+e- \qquad \text{(Equation 2)}$$

Based on the mechanisms of water oxidation described above, we can expect strong dependence of catalytic activity on the electrolyte pH as was confirmed by the data shown in FIG. 4.

Example 3

Example 3 illustrates a novel method of electrochemical deposition from aqueous solution for manganese based catalyst.

Electrodeposition of MnO from Aqueous Solution

Manganese oxide was electrodeposited on the surface of gold and fluorine doped tin oxide (FTO) the electrolyte containing 0.01 M manganese acetate and at least one aqueous supporting electrolyte based on an organic salt. Preferably the organic salt contains an organic cation such as primary, secondary, tertiary or quaternary type nitrogen or phosphorous are used in the electrolyte, typically at concentrations from 0.01M to 5M. During deposition, the cation of the supporting electrolyte was embedded in the interlayer of the birnesite structure of manganese dioxide, thus, becoming part of the catalyst.

While this invention has been described in connection with specific embodiments thereof, it will be understood that it is capable of further modification(s). This application is intended to cover any variations uses or adaptations of the invention following in general, the principles of the invention and including such departures from the present disclosure as come within known or customary practice within the art to which the invention pertains and as may be applied to the essential features hereinbefore set forth.

As the present invention may be embodied in several forms without departing from the spirit of the essential characteristics of the invention, it should be understood that the above described embodiments are not to limit the present invention unless otherwise specified, but rather should be construed broadly within the spirit and scope of the invention as defined in the appended claims. The described embodiments are to be considered in all respects as illustrative only and not restrictive.

Various modifications and equivalent arrangements are intended to be included within the spirit and scope of the invention and appended claims. Therefore, the specific embodiments are to be understood to be illustrative of the many ways in which the principles of the present invention may be practiced. In the following claims, means-plus-function clauses are intended to cover structures as performing the defined function and not only structural equivalents, but also equivalent structures.

"Comprises/comprising" and "includes/including" when used in this specification is taken to specify the presence of stated features, integers, steps or components but does not preclude the presence or addition of one or more other features, integers, steps, components or groups thereof. Thus, unless the context clearly requires otherwise, throughout the description and the claims, the words 'comprise', 'comprising', 'includes', 'including' and the like are to be construed in an inclusive sense as opposed to an exclusive or exhaustive sense; that is to say, in the sense of "including, but not limited to".

The claims defining the invention are as follows:

1. A method of preparing a semiconductor or a semiconductor material of a catalyst, the catalyst comprising:
   the semiconductor, and
   the semiconductor material having the formula $M'_m A'_a P_y$ wherein:
   M' is a metal,
   A' is a Group VIb species,
   m' has a value of between 1 and 5,
   a' has a value of between 1 and 5,
   P is a phosphorous species, and
   y has a value $0<y<5$;
   the method comprising the steps of:
   preparing an aqueous solution comprising at least one principal electrolyte and at least one supporting electrolyte,
   applying a source of energy to the aqueous solution, and
   depositing the principal electrolyte, and optionally the supporting electrolyte at a cathode using electrolysis.

2. The method according to claim 1 wherein the supporting electrolyte is chosen from the group comprising primary, secondary, tertiary or quaternary nitrogen or phosphorous species or combinations thereof.

3. The semiconductor comprised in the catalyst prepared by the method of claim 1.

4. The semiconductor material having phosphorous content comprised in the catalyst prepared by the method of claim 1.

5. The method according to claim 1 wherein M' is chosen from the group comprising Ti, Mo, Mn, Fe, Co, Ni, Cu, Zn, Ga, Ir, Cd, In, Sn, the rare-earth metals, alone or in combination.

6. The method according to claim 1 wherein A' is chosen from the group comprising oxygen, sulphur, selenium and tellurium.

7. A method of preparing a catalyst comprising a semiconductor and a semiconductor material having the formula $M'_m A'_a P_y$ wherein:
   M' is a metal,
   A' is a Group VIb species,
   m' has a value of between 1 and 5,
   a' has a value of between 1 and 5,
   P is a phosphorous species, and
   y has a value $0<y<5$
   the method comprising preparation of the catalyst or the semiconductor or semiconductor material using the steps of:
   preparing an ionic liquid comprising at least one electrolyte,
   applying a source of energy to elevate the temperature of the ionic liquid to at least 130° C., and
   depositing the at least one electrolyte at a cathode using electrolysis.

8. An electrodeposition process comprising the steps of:
   preparing an ionic liquid comprising at least one electrolyte,
   applying a source of energy to elevate the temperature of the ionic liquid to at least 130° C., and
   depositing the at least one electrolyte at a cathode using electrolysis.

9. A process for splitting water into hydrogen and oxygen, the process including the step of suspending a photo-electro catalyst in water, the photo-electro catalyst comprising:
   a semiconductor, and
   a semiconductor material having the formula $M'_m A'_a P_y$ wherein:
   M' is a metal,
   A' is a Group VIb species,
   m' has a value of between 1 and 5,
   a' has a value of between 1 and 5,
   P is a phosphorous species, and
   y has a value $0<y<5$.

* * * * *